(12) United States Patent
Tsai et al.

(10) Patent No.: US 12,353,142 B2
(45) Date of Patent: Jul. 8, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Cheng Hung Tsai, Hsinchu (TW); Sheng-Kang Yu, Hsinchu (TW); Shang-Chieh Chien, New Taipei (TW); Heng-Hsin Liu, New Taipei (TW); Li-Jui Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 406 days.

(21) Appl. No.: 17/657,528

(22) Filed: Mar. 31, 2022

(65) Prior Publication Data

US 2022/0413398 A1    Dec. 29, 2022

Related U.S. Application Data

(60) Provisional application No. 63/214,578, filed on Jun. 24, 2021.

(51) Int. Cl.
*G03F 7/00*    (2006.01)

(52) U.S. Cl.
CPC ...... *G03F 7/70916* (2013.01); *G03F 7/70033* (2013.01); *G03F 7/70875* (2013.01)

(58) Field of Classification Search
None
See application file for complete search history.

(56) References Cited

U.S. PATENT DOCUMENTS

| | | | |
|---|---|---|---|
| 2011/0226745 A1* | 9/2011 | Nagai | G03F 7/70925 219/121.62 |
| 2020/0037427 A1* | 1/2020 | Yang | G03F 7/2004 |
| 2020/0041908 A1* | 2/2020 | Yen | G03F 7/70916 |
| 2021/0059035 A1* | 2/2021 | Kim | H05G 2/005 |
| 2023/0418171 A1* | 12/2023 | Yabuta | G03F 7/70166 |

* cited by examiner

*Primary Examiner* — Eliza W Osenbaugh-Stewart
(74) *Attorney, Agent, or Firm* — Harrity & Harrity, LLP

(57) ABSTRACT

An extreme ultraviolet (EUV) source includes a collector associated with the vessel. The extreme ultraviolet (EUV) source includes a plurality of vanes along walls of the vessel. Each vane includes a stacked vane segment, and the stacked vane segments for each vane are stacked in a direction of drainage of tin (Sn) in the vessel. The EUV source includes a thermal control system comprising a plurality of independently controllable heating elements, where a heating element is configured to provide localized control for heating of a vane segment of the stacked vane segments.

19 Claims, 12 Drawing Sheets

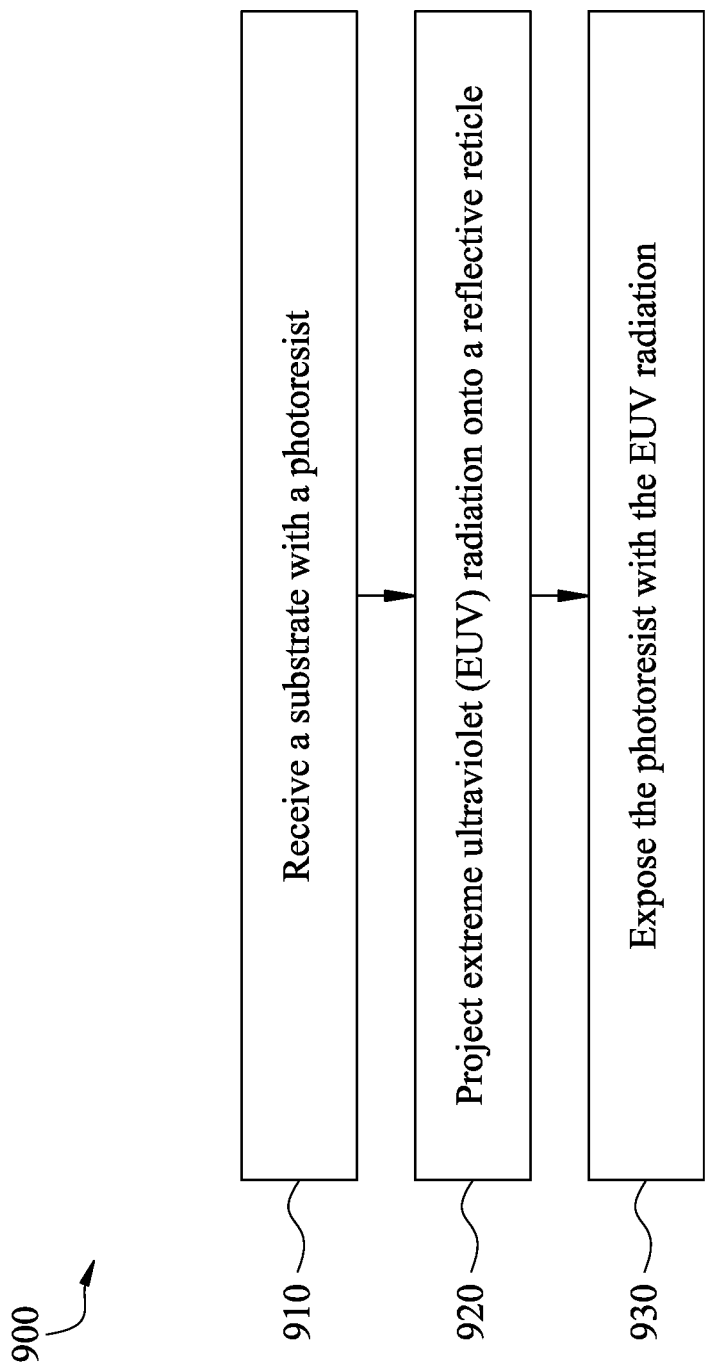

SEMICONDUCTOR PROCESSING TOOL AND METHODS OF OPERATION

CROSS-REFERENCE TO RELATED APPLICATION

This Patent Applications claims priority to U.S. Provisional Patent Application No. 63/214,578, filed on Jun. 24, 2021, and entitled "SEMICONDUCTOR PROCESSING TOOL AND METHODS OF OPERATION." The disclosure of the prior Applications is considered part of and is incorporated by reference into this Patent Applications.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart of an example process relating to a lithography exposure operation described herein.

DETAILED DESCRIPTION

Figure 1:
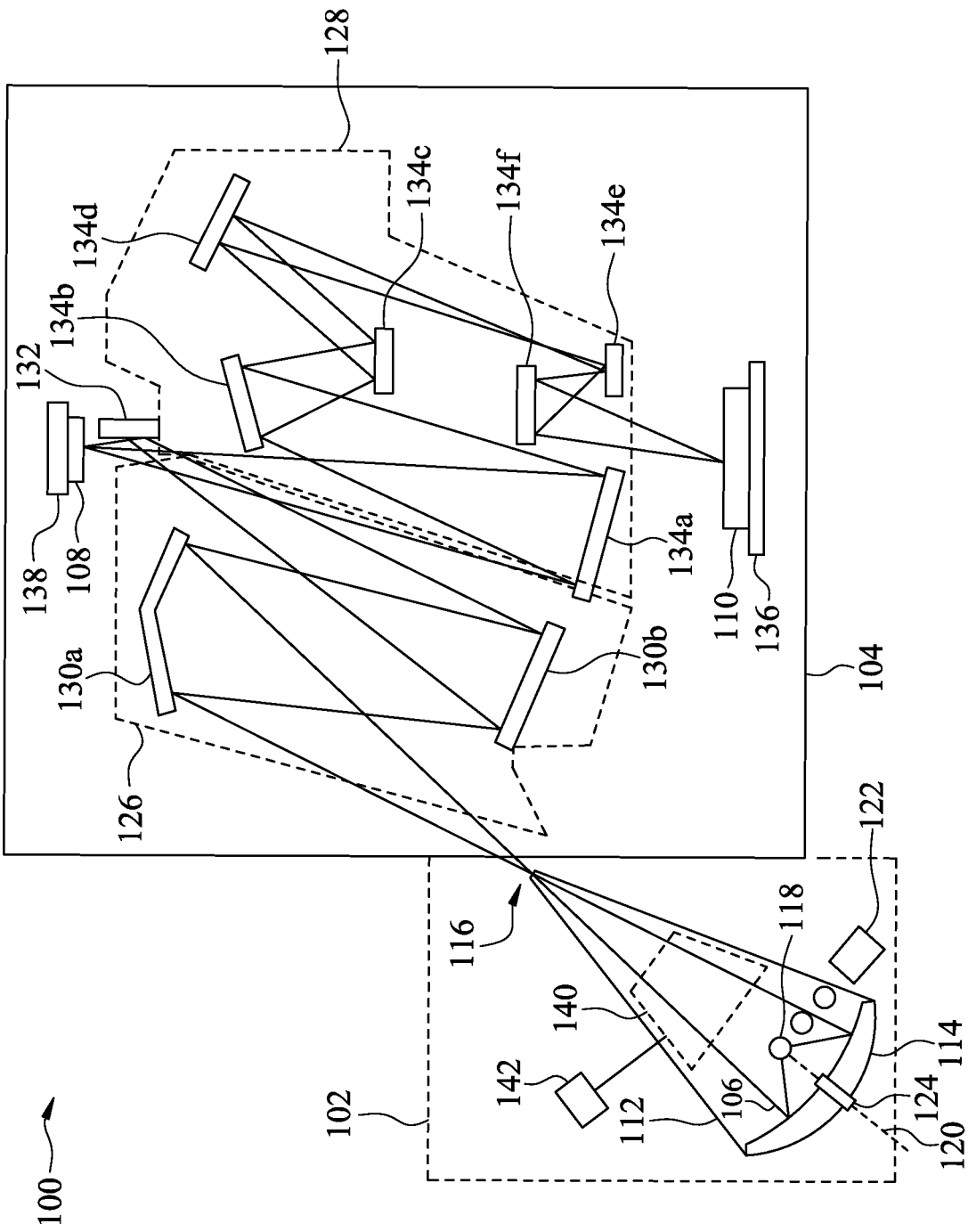
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For an extreme ultraviolet (EUV) source, vessel cleanness has a direct impact on the service lifetime and performance of a collector included in the EUV source. In particular, maintaining a clean vessel reduces the risk of tin (Sn) clogging and tin spitting, which might otherwise result in tin dripping onto the collector. If tin drips onto the collector, the collector may become contaminated, which reduces the reflectivity of the collector. In some cases, the temperature distribution in the vessel (e.g., on the walls of the vessel) during the operation of the EUV source may be non-uniform, which can result in the formation of hot spots and cold spots in the vessel. The hot spots and cold spots may increase the likelihood and amount of tin accumulation on the walls of the vessel, which may increase the likelihood of tin clogging and tin spitting. This may increase the likelihood of collector contamination and reduced EUV source performance, as well as increased maintenance and downtime.

Implementations described herein provide a proactive thermal control system for an EUV source. The thermal control system may include segmented thermal control elements (e.g., vane segments) that are configured to provide localized climate control to sustain a stable vessel temperature. The thermal control system may determine and/or detect temperature variations (e.g., thermal gradients, hot spots, cold spots) on the walls of a vessel of the EUV source. The thermal control system may adjust one or more parameters of nearby thermal control elements (e.g., heaters, coolers) based on the temperature variations to balance the differences in temperature along the walls of the EUV source. In this way, the thermal control system is capable of removing, preventing, and/or minimizing localized tin clogging and tin spitting. This reduces the likelihood and amount of tin accumulation on the walls of the vessel, which decreases the likelihood of collector contamination and enables sustained EUV source performance for longer time durations between maintenance (which corresponds to reduced downtime of the EUV source).

FIG. 1 is a diagram of an embodiment of a lithography system 100 described herein. The lithography system 100 includes an extreme ultraviolet (EUV) lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes the radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 (e.g., tin (Sn) droplets or another type of droplets) being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide ($CO_2$) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser 120 is pulsed at a timing that is synchronized with the flow of the droplets 118 from the DG head 122.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors includes, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors includes, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a substrate stage 136 (e.g., a wafer stage) configured to support the semiconductor substrate 110. Moreover, the substrate stage 136 is configured to move (or step) the semiconductor substrate 110 through a plurality of exposure fields as the radiation 106 transfers the pattern from the reticle 108 onto the semiconductor substrate 110. The exposure tool 104 also includes a reticle stage 138 that configured to support and/or secure the reticle 108. Moreover, the reticle stage 138 is configured to move or slide the reticle through the radiation 106 such that the reticle 108 is scanned by the radiation 106. In this way, a pattern that is larger than the field or beam of the radiation 106 may be transferred to the semiconductor substrate 110.

The vessel 112 includes a vane system 140. The vane system 140 is configured to collect tin debris in the vessel 112 and to facilitate the drainage of the tin debris out of the vessel 112 to maintain the cleanliness of the vessel 112. A controller 142 of the lithography system 100 is configured to provide thermal control of the sidewalls of the vessel 112. As described herein, the vessel sidewalls are susceptible to tin accumulation (e.g., debris) during an exposure operation. To mitigate the tin accumulation, the vane system 140 is controlled to a temperature to facilitate drainage of the tin accumulation from the vessel 112. Drainage of the tin accumulation reduces the impact of the tin accumulation on the cleanliness and performance of the collector, as well as reduces the likelihood of contamination of the reticle 108 and other components in the exposure tool 104.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As indicated above, FIG. 1 is provided as an example. Other examples may differ from what is described with regard to FIG. 1.

Figure 2B:
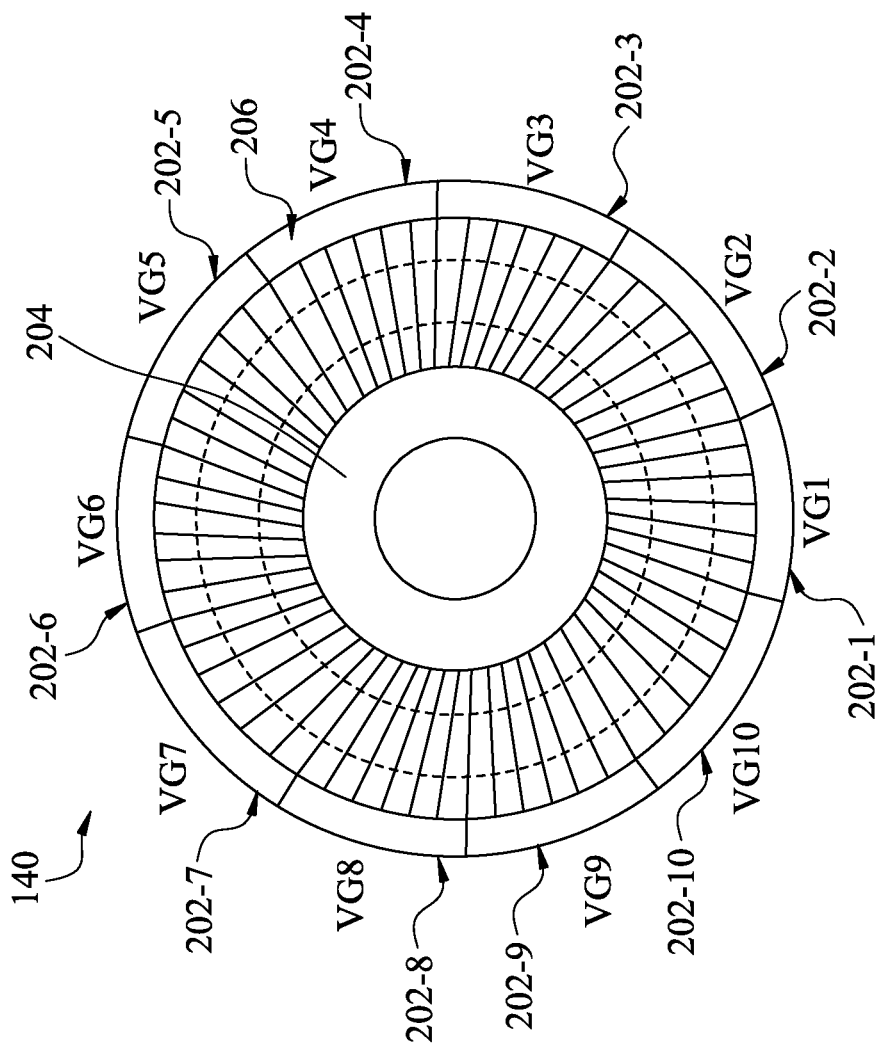
FIG. 2B is a bottom-view diagram of the example vane groups components described herein for use in the lithography semiconductor processing tool of FIG. 1.
Figure 2A:
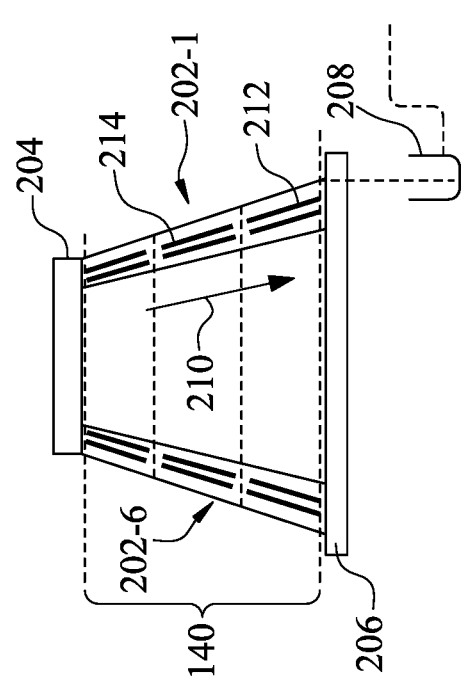
FIG. 2A is a side-view diagram of example vane groups components described herein for use in the lithography semiconductor processing tool of FIG. 1.

FIGS. 2A and 2B are diagrams of an example vane system 140 described herein. FIG. 2A illustrates a cross-sectional view diagram of example vane system 140 in the vessel 112 described herein for use in the lithography system 100 of FIG. 1. FIG. 2B illustrates a bottom-up view or collector-side view of the vane system 140. The vane system 140 includes a plurality of vane groups 202. As shown in the cross-sectional view of FIG. 2A, the plurality of vane groups 202 includes, for example, a vane group 202-1 and an opposite-sided vane group 202-6. While a specific quantity of vane groups is illustrated, a greater quantity or a fewer quantity is within the scope of the present disclosure.

As shown in FIG. 2A, the vessel 112 further includes a scrubber 204. The scrubber 204 removes vapor (e.g., tin (Sn)

vapor) from the vessel 112 and may assist in draining liquid (e.g., condensed tin particles) from the vessel 112. The vessel 112 further includes a collector flow ring 206 and catcher (e.g., container) 208. The collector flow ring 206 may be included between the collector 114 and the vane system 140. The collector flow ring 206 provides drainage of the condensed tin particles in a direction 210, and the catcher 208 captures the condensed tin particles received from the collector flow ring 206.

In some implementations, the vessel 112 further includes a plurality of heating elements 212. The heating elements 212 are configured to generate heat to increase the temperature of a portion or segment of a vane of a vane group 202. The increased temperature causes tin particles that land on one or more vanes in the one or more vane groups 202 to melt and drain toward the catcher 208 in a direction 210 of drainage. In some implementations, the vane system 140 further includes one or more cooling elements 214. The cooling element 214 may be configured to reduce the temperature of one or more of the portions or segments of a vane in a vane group 202.

As shown in FIG. 2B, the vane system 140 includes vane groups 202, illustrated in a radially distributed arrangement. In an example, the vane groups 202 may include vane group 202-1 through vane group 202-10. Although ten vane groups are illustrated, other quantities of vane groups 202, such as a greater number of vane groups 202 and a lesser number of vane groups 202, are within the scope of the present disclosure. As illustrated in FIG. 2B, the vane groups 202 are arranged radially adjacent between scrubber 204 and collector flow ring 206.

As indicated above, FIGS. 2A and 2B are provided as examples. Other examples may differ from what is described with regard to FIGS. 2A and 2B.

FIGS. 3A-3D illustrate example segmentation of vanes into vane segments described herein. Localized thermal controls and sensing are associated the vane segments to provide localized temperature control along the vane to manage tin accumulation in the vessel 112.

Figure 3A:
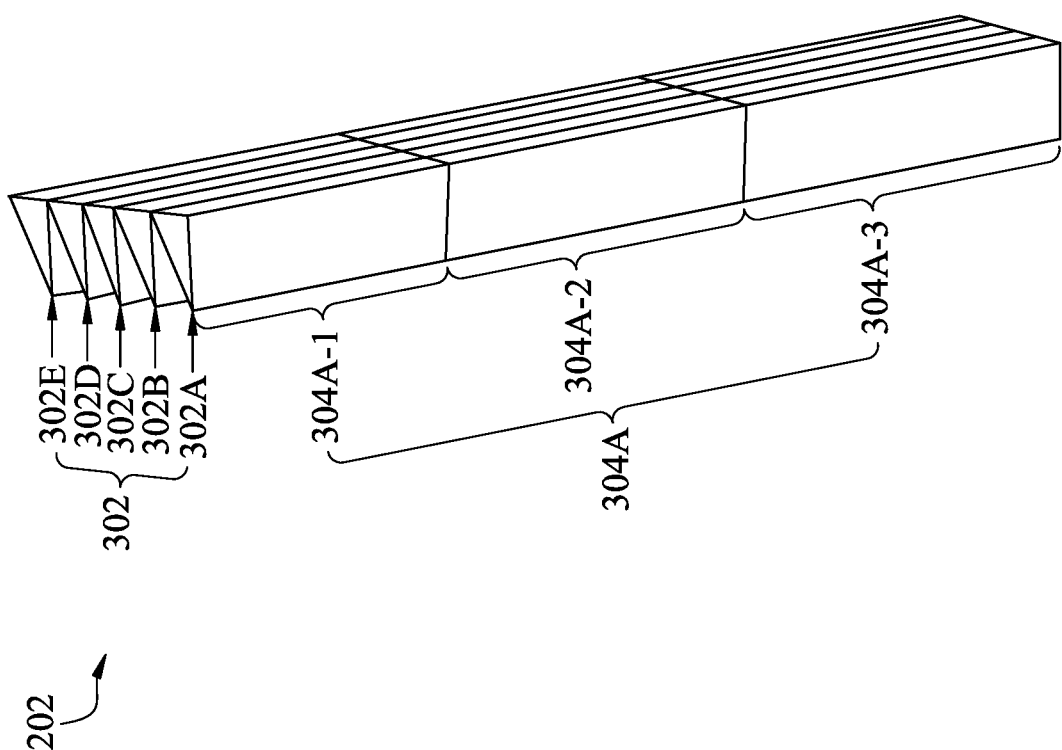
FIGS. 3A-3D are diagrams of an example implementation described herein.

FIG. 3A illustrates an example vane group in an example vessel described herein for use in the lithography semiconductor processing tool of FIG. 1. The vane group 202 includes one or more vanes 302. In an example, vane group 202 includes five vanes 302, such as vanes 302A through 302E. The vanes 302 may be grouped into vane groups, such as vane group 202, for manageability, such as for manufacturing, operation, and maintenance. While the example vane group 202 is illustrated as having five vanes 302, other examples including a greater quantity of vanes or a lesser quantity of vanes are within the scope of the present disclosure.

In some implementations, the vanes 302 are segmented or divided into a plurality of vane segments 304A. In an example, vane 302A is divided into vane segments 304A-1, 304A-2, and 304A-3. While three vane segments are illustrated in the example vane group of FIG. 3A, a greater quantity or a lesser quantity of vane segments is also within the scope of the present disclosure. The segmentation of the vanes 302 may include physical segmentation (e.g., each of vane segments 304A is modular and independently removable relative to other vane segments 304A), logical segmentation (e.g., each of vane segments 304A of a vane 302A corresponds to a logically controllable portion of the vane 302A that is independently temperature controllable relative to other portions of the vane 302A), or a combination thereof.

As shown in FIG. 3A, the vane segments 304A-1 through 304A-3 are segmented along the length of vane 302A. In other words, the vane 302A is segmented into the plurality of vane segments 304A-1 through 304A-3 in a direction between the scrubber 204 and the collector flow ring 206, and in the direction 210 of drainage of tin particles in the vessel 112. Vanes 302B, 302C, 302D, and 302E may be similarly segmented into respective vane segments. Segmentation of the vanes 302 is along the direction 210 of drainage of the tin particles in the vessel 112. Segmentation of the vanes 302 provides for independent control of temperatures along the length of the vanes 302. In some implementations, the independent temperature control accommodates temperature variations along the length of the vane. In some examples, the temperature variations may be due to differences in local temperature conditions within the vessel 112. In some examples, the temperature variations may be due to localization of heat sources within or near the vane. In other examples, the temperature variations may be due to differences of thermal conductivity along the length of the vane. In some other examples, the temperature variations may be due to changes (e.g., aging) of the thermal capabilities along the length of the vane.

In some examples, the vane segments 304A may be approximately equally sized. In other examples, the vane segments 304A are differently sized with some of vane segments 304A being longer and/or larger in size that others of vane segments 304A.

Figure 3B:
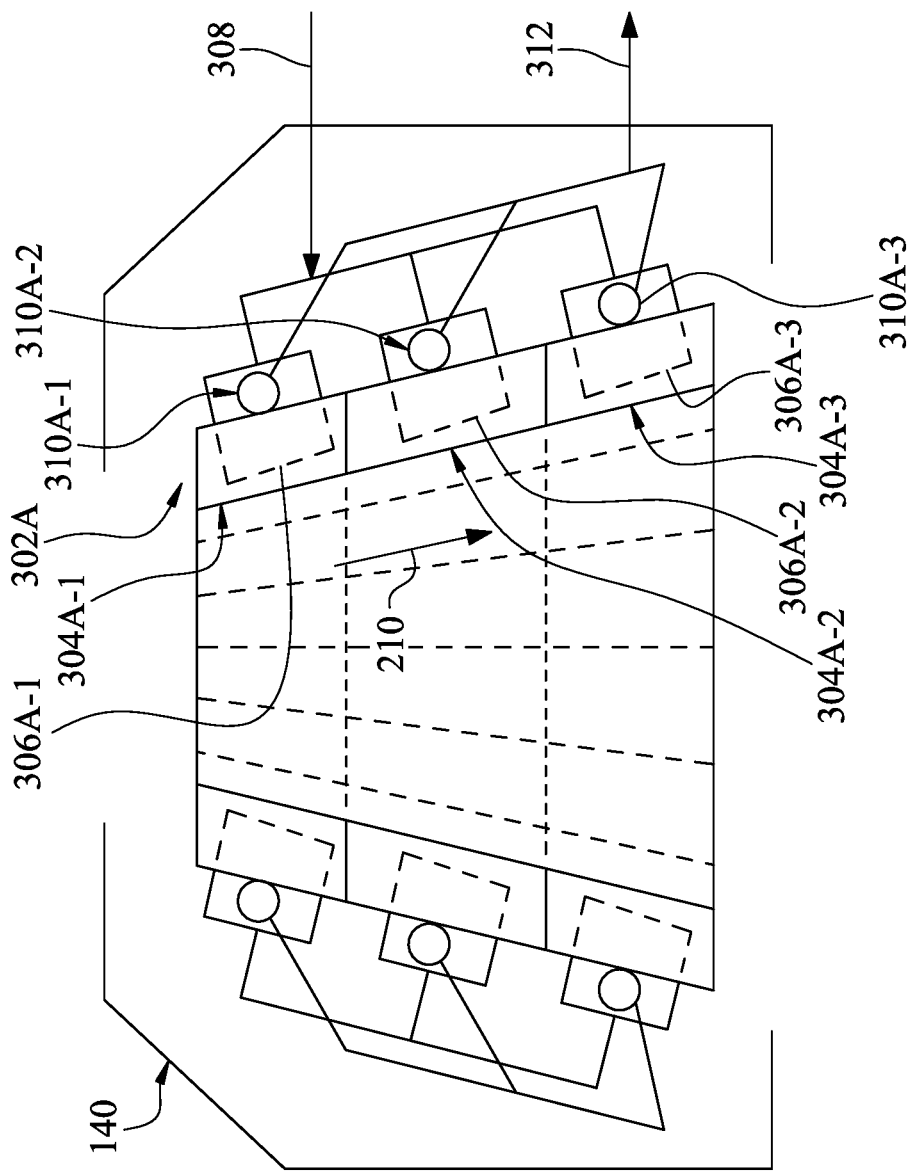

FIG. 3B illustrates a cross-sectional view of the example vane system 140 described herein for use in the lithography semiconductor tool of FIG. 1. As described, the vane system 140 is configured to manage tin accumulation in the vessel 112. Management of tin accumulation is provided by controlling the temperature in the vane system 140 to facilitate drainage of the tin accumulation from the vessel 112.

As show in FIG. 3B, the vane system 140 includes a plurality of vanes 302, an example of which is vane 302A. As illustrated, vane 302A includes vane segments 304A-1, 304A-2, and 304A-3. The vane segments 304A are adjacently configured longitudinally along the vane 302A in a direction 210 of drainage of the tin accumulation. The vane segments 304A are individually controllable to provide localized temperature control along the vane 302A. Vanes 302B through 302E may be similarly configured.

In some implementations, the vane system 140 includes heating elements 306A-1 through 306A-3 respectively associated with vane segments 304A. As illustrated, heating elements 306A-1 through 306A-3 are respectively associated with vane segments 304A-1, 304A-2, and 304A-3. The heating elements 306A-1 through 306A-3 are individually controlled by heating control signals 308. In some implementations, the heating elements 306A-1 through 306A-3 are located within (e.g., internal to) the vane segments 304A. In some implementations, the heating elements 306A-1 through 306A-3 are located on an exterior surface of the vane segments 304A-1 through 304A-3.

To provide localized thermal control of the vane 302A, the vane system 140 monitors temperatures along the length of the vane 302A, generates sensor data associated with the temperatures along the length of the vane 302A, and/or a combination thereof. In some implementations, the vane system 140 includes sensors 310A-1 through 310A-3. The sensors 310A-1 through 310A-3 include thermocouples, resistance temperature detectors (RDTs), thermistors, and/or other types of temperature sensors. As illustrated, sensors 310A-1 through 310A-3 are respectively associated with vane segments 304A-1 through 304A-3. The sensors 310A-1 through 310A-3 are individually monitored and generate sensor signals 312 (e.g., an indication of the temperature). In this way, each of sensors 310A-1 through 310A-3 provides individual, independent, and localized temperature monitoring of an associated vane segment 304A, which increases the temperature monitoring accuracy of the vane system 140 and increases the capability of identifying hot spots and cold spots in the vane system 140. In some implementations, the sensors 310A-1 through 310A-3 are located within the vane segments 304A-1 through 304A-3. In some examples, the sensors 310A-1 through 310A-3 are internal to the vane segments 304A-1 through 304A-3. In some implementations, the sensors 310A-1 through 310A-3 are located on the vane segments 304A-1 through 304A-3. In some examples, the sensors 310A-1 through 310A-3 are associated to an exterior surface of the vane segments 304A-1 through 304A-3.

Figure 3C:
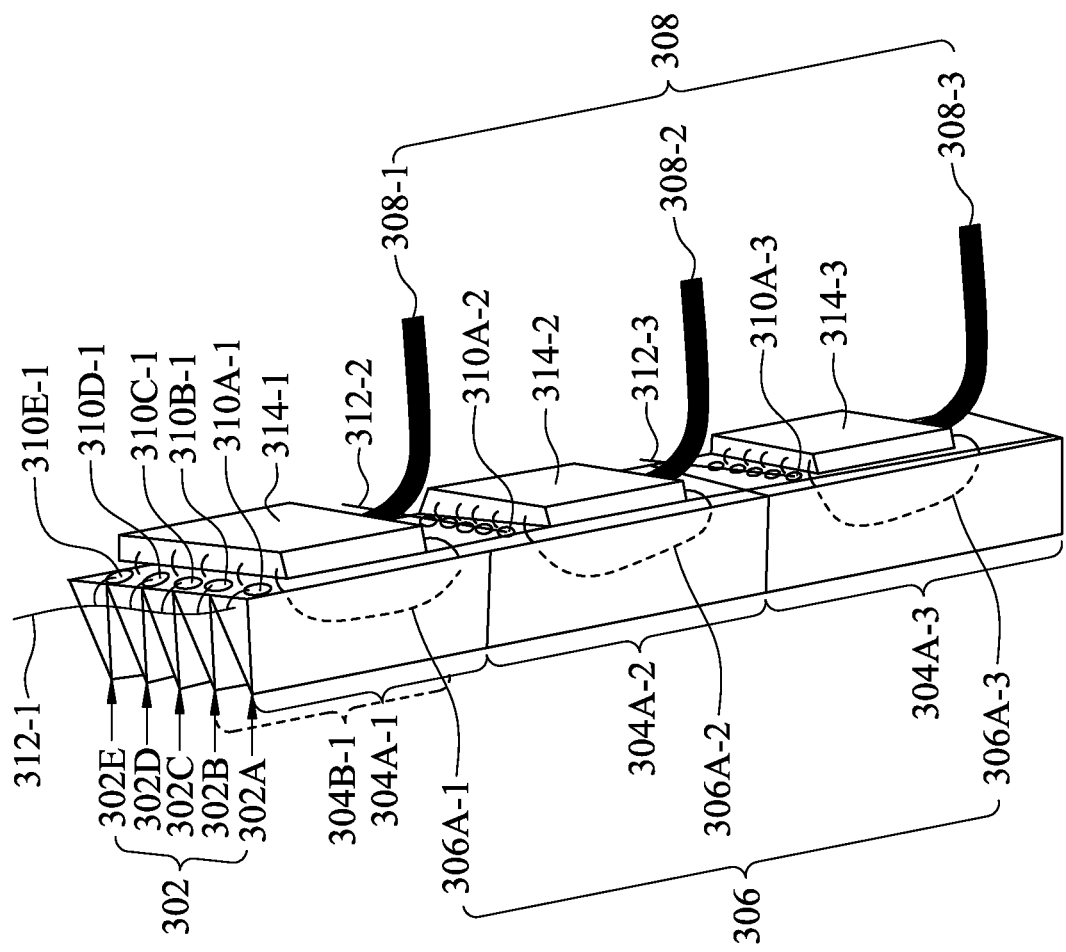

FIG. 3C illustrates a perspective view of a vane group 202 described herein for use in the lithography semiconductor tool of FIG. 1. As described, the vane system 140, including the vane group 202, is configured to manage tin accumulation in the vessel 112. As described, the vane group 202 includes one or more vanes 302, an example of which are vanes 302A through 302E. The vanes 302 are segmented into a plurality of vane segments 304A. For example, vane segments 304A-1 through 304A-3 may comprise at least a portion of the vane segments 304A along vane 302A. Other vanes, such as vane 302B, are laterally adjacent to vane 302A. Vane 302B may include vane segments, one of which for brevity is illustrated as vane segment 304B-1, and is laterally located next to vane segment 304A-1.

As described, the vane system 140 is configured to provide localized thermal control (e.g., heating or cooling) along the length of the vanes 302. Heating elements 306A-1 through 306A-3 are respectively associated with vane segments 304A-1 through 304A-3. In an implementation, heating elements 306A-1 through 306A-3 are integrated within the vane segments 304A-1 through 304A-3. For example, heating element 306A-1 includes a resistive heating element such as a heating wire that responds to heating control signals 308-1 to generate a localized temperature at the vane segment 304A-1. In these examples, a heating control signal 308-1 may propagate through the heating element 306A-1, and the heating element 306A-1 converts the heating control signal 308-1 from electrical energy (e.g., an electrical current) to thermal energy as a result of the electrical resistance of the heating element 306A-1. In some implementations, the heating elements 306A1 through 306A-3 are applied to one or more surfaces of the vane segments 304A-1 through 304A-3. In some implementations, heating control signals 308-1 may provide multiple heating control signals. For example, heating elements in first vane segments of vanes 302A through 302E may respond to heating control signals 308-1 to generate different temperatures at the first vane segments of vanes 302A through 302E.

In some implementations, the vane system 140 includes heating packs 314-1 through 314-3. Heating packs 314-1 through 314-3 may provide distribution of heating control signals 308-1 through 308-3 to respective heating elements 306A-1 through 306A-3. For example, heating pack 314-1 distributes heating control signals 308-1 to vane segments 304A-1, 304B-1, and to other laterally adjacent vane segments in vanes 302C through 302E. Similarly, heating pack 314-2 distributes heating control signals 308-2 to vane segment 304A-2 and other laterally adjacent vane segments in vanes 302B through 302E.

In some implementations, heating packs 314-1 through 314-3 may include heating elements 306A-1 through 306A-3 for conductively providing heat to the respective vane segments. For example, heat pack 314-1 may include heating element 306A-1 and, responsive to heating control signal 308-1, heat pack 314-1 may generate heat within heating pack 314-1 and conductively differently heat to one or more of vane segments, such as 304A-1, 304B-1, and/or another one or more of the vane segments laterally adjacent to vane segments in vanes 302C through 302E. The described implementations and examples are also applicable to other respective heating packs 314-2 and 314-3, heating control signals 308-2 and 308-3, and their corresponding heating elements and vane segments that may not be explicitly numbered for clarity.

The vane system 140 further includes sensors 310A-1 through 310A-3, and other respective sensors in vanes 302B through 302E. Each sensor is configured to provide feedback relating to a temperature of a specific vane segment of a specific vane. In some implementations, sensors 310A-1 through 310A-3 are respectively associated with vane segments 304A-1 through 304A-3. In some implementation, sensors 310A-1 through 310A-3 are integrated within the vane segments 304A-1 through 304A-3. For example, sensor 310A-1 senses a temperature within vane segment 304A-1 and generates sensor signals 312-1 based on the sensed temperature. In some implementations, the sensors 310A-1 through 310A-3 are attached to one or more surfaces of the vane segments 304A-1 through 304A-3 and sense temperatures at the surfaces of vane segments 304A-1 through 304A-3. In some implementations, the sensors 310A-1 through 310A-3 are attached to external surfaces of the vane segments 304. In yet other implementations, the sensors 310A-1 through 310A-3 are integrated with the heating packs 314-1 through 314-3.

Figure 3D:
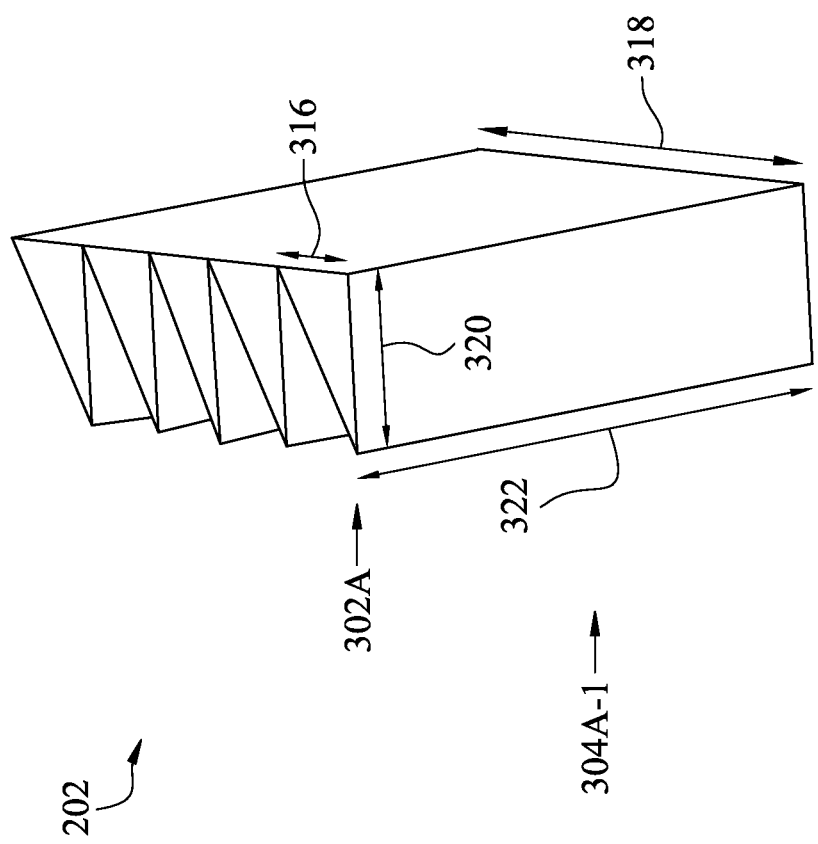

FIG. 3D illustrates a perspective view of a portion of an example vane group 202. While dimensions are illustrated herein, the dimensions are illustrative and approximate. Further, dimensions are also a function of a size of the vessel 112 and the partitioning and grouping of vanes into vane groups.

In some implementations, a vane group 202 may have an approximate vane width 316 that is included in a range of approximately 3 centimeters (cm) to approximately 7 cm for an example vane, such as vane 302A. Accordingly, a vane group width 318 may be a function of the quantity of vanes 302 in each vane group 202. As illustrated in FIG. 3D, the vane group 202 includes five vanes 302 for an approximate vane group width 318 of approximately 15 cm to approximately 35 cm. In an example, vane 302A is configured with a vane depth 320 that is included in a range of approximately 5 cm to approximately 15 cm. In an example, vane 302A is configured with a vane height 322 of approximately 50 cm to approximately 70 cm. The size of the vanes may be selected to provide more flexible vane temperature control while maintaining suitable cost and manufacturability.

As indicated above, FIGS. 3A-3D are provided as examples. Other examples may differ from what is described with regard to FIGS. 3A-3D.

Figure 4:
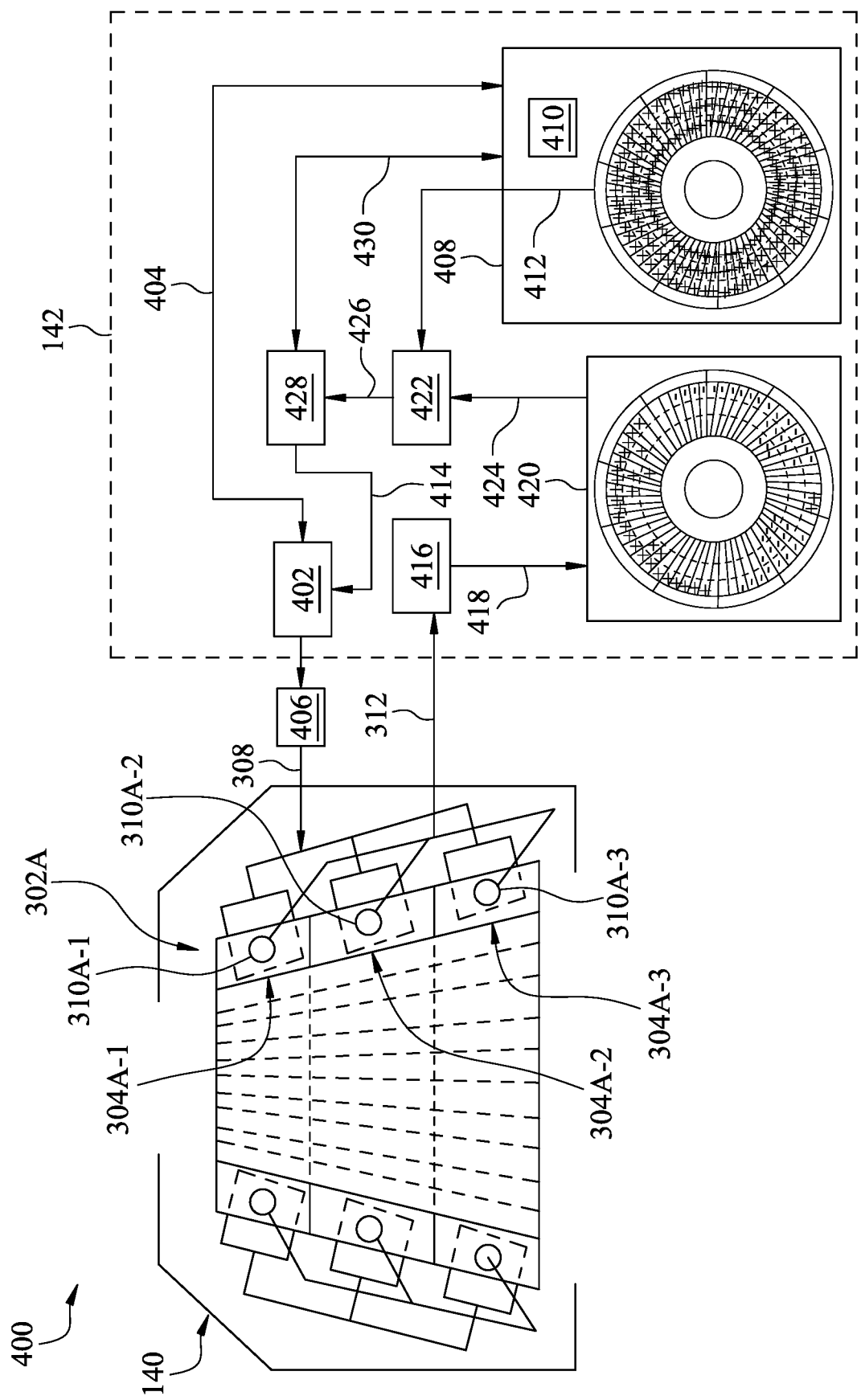
FIG. 4 is a diagram of an example thermal control system described herein for use in the lithography semiconductor processing tool of FIG. 1.

FIG. 4 is a diagram of an example thermal control system described herein for use in the lithography semiconductor processing tool of FIG. 1. A thermal control system 400 includes vane system 140 and controller 142. As described, thermal control system 400 is configured to provide localized climate control to sustain a stable vessel temperature. The thermal control system 400 determines and/or detects temperature variations (e.g., thermal gradients, hot spots, cold spots) on the walls of a vessel 112 of an EUV source (e.g., the radiation source 102). The thermal control system 400 adjusts one or more parameters of nearby thermal control elements (e.g., heating element 212, cooling element 214) based on the temperature variations to balance the differences in temperature along the walls of the EUV source.

Vane system 140 is described herein with respect to at least FIGS. 3A-3D. Controller 142 is configured to operate the vane system 140 based upon sensor data and a temperature profile map, and to generate control signals that control the operation of the vane system 140. In some implementations, the controller 142 performs an adjustable setpoint management operation 402. The adjustable setpoint management operation 402 retrieves adjustable setpoints 404 and uses the adjustable setpoints 404 to configure a power supply 406. The power supply 406 then generates heating control signals 308 to cause the heating elements 306 to generate an amount of heat in response to values of the adjustable setpoints 404. In one example, the adjustable setpoints 404 are stored in a setpoint temperature profile map 408 as adjustable setpoint data 410. Each of the adjustable setpoints 404 in the adjustable setpoint data 410 corresponds to a desired or expected temperature. The desired or expected temperature is stored in the setpoint temperature profile map 408 as setpoint temperatures 412. In one example, the setpoint temperatures 412 may all be equal in value to cause the vessel 112 to be maintained at a constant temperature. In one example, the setpoint temperatures 412 may have different values to cause a varied temperature within the vessel 112.

In an example, the setpoint temperature profile map 408 may be configured as a database, a table, or a list which includes identifiers for vane segments and their respective setpoint temperatures 412. In an example, setpoint temperature profile map 408 provides a graphical image of warmer or cooler setpoint temperatures along the vanes 302 of a vessel 112. In an example, the setpoint temperature profile map 408 may be colorized to illustrate warmer and cooler areas along the vanes 302 of the vessel 112.

In some implementations, the adjustable setpoint management operation 402 may automatically (e.g., based on a trigger) or periodically retrieve the adjustable setpoints 404 and reconfigure the power supply 406 based on the periodically retrieved adjustable setpoints 404. In some implementations, the adjustable setpoint management operation 402 may manually (e.g., in response to a specific request or intervention) retrieve the adjustable setpoints 404 and reconfigure the power supply 406 based on the values of the retrieved adjustable setpoints 404. In some implementations, the adjustable setpoint management operation 402 may retrieve the adjustable setpoints 404 and reconfigure the power supply 406 with the retrieved adjustable setpoints 404 based on a trigger 414 as further described herein.

As conditions and configurations vary within the vessel 112, the adjustable setpoints 404 may need to be adjusted or modified to cause the vane segments, for example the vane segments 304A-1 through 304A-3, to achieve the desired setpoint temperatures 412. In some examples, various components within the vane system 140 may have aged or otherwise exhibit performance deviations that require the adjustments or modifications to the adjustable setpoints 404 in order to achieve the desired setpoint temperatures 412. These deviations may be detected by sensing or measuring actual temperatures at the respective vane segments.

In some implementations, the controller 142 is further configured to perform sensing operation 416. During sensing operation 416, the controller 142 receives sensor signals 312, which may include sensor signals 312-1 through 312-3 as described. The sensing operation 416 transforms sensor signals 312 into sensed (e.g., determined, identified) temperature data 418 that is in a format capable of being compared or evaluated with other data. The sensed temperature data 418 may include data from all or a portion of the sensors of the vane segments in the vessel 112. In one example, the temperature data 418 may include sensed temperature data generated by sensors 310A-1 through 310A-3.

The sensing operation 416 stores the sensed temperature data 418 in one or more formats. In an example, the controller 142 stores the sensed temperature data 418 as a vane system temperature profile map 420. In an example, the vane system temperature profile map 420 may be configured as a database, a table, or a list which includes identifiers for the vane segments and their respective corresponding sensed temperature data 418. In an example, vane system temperature profile map 420 provides a graphical image of "hot spots" and "cold spots" along the vanes 302 in the vane groups 202 of a vessel 112. In an example, the vane system temperature profile map 420 may be colorized to graphically illustrate "hot spots" and "cold spots."

A "hot spot" on a vane is an area of the vane where the sensed temperature is greater than a desired or setpoint temperature of the location (e.g., vane segment) on the vane. When a temperature is significantly higher than the setpoint temperature, tin particles traversing a "hot spot" may be susceptible to undesirable abrupt out-gassing of gases (e.g., hydrogen) trapped within the tin particles. The out-gassing causes undesirable flaking or "spitting" of tin particles within the vane system 140.

A "cold spot" on a vane is an area of the vane where the sensed temperature is less than the desired or setpoint temperature of the location (e.g., vane segment) on the vane. When a temperature is significantly lower than the setpoint temperature, tin particles traversing a "cold spot" begin to solidify and cease traversing the vane. The term "clogging" may also be used to describe the solidifying of the tin particles as a result of the sensed temperature being less than the desired or setpoint temperature.

In some implementations, a comparison operation 422 receives one or more sensor temperatures 424 from vane system temperature profile map 420. The comparison operation 422 also receives one or more desired setpoint temperatures 412 from the setpoint temperature profile map 408. The sensor temperatures 424 and the setpoint temperatures 412 are respectively associated with the same vane segments. The comparison operation 422 compares the one or more sensor temperatures 424 to the respective one or more of the desired or setpoint temperatures 412.

In an example, the controller 142 uses one or more of the setpoint temperatures 412 from the setpoint temperature profile map 408 in a comparison operation 422 with a respective one or more of the sensor temperatures 424. In some implementations, the controller 142 compares, in the comparison operation 422, a particular sensor temperature 424, associated with a particular location on vane system temperature profile map 420, with a setpoint temperature 412 associated with the corresponding particular location in the setpoint temperature profile map 408. In the comparison operation 422, the controller 142 generates or determines one or more differences 426. In an example, the one or more differences 426 are respective differences between the sensor temperatures 424 and the setpoint temperatures 412.

In some implementations, the controller 142 further generates or obtains the setpoint temperature profile map 408 (e.g., obtains from a data structure such as a memory device, a file system, a database, or another type of data structure). The setpoint temperature profile map 408 includes data indicating setpoint temperatures 412 and adjustable setpoint data 410 which includes the adjustable setpoints 404. The setpoint temperatures 412 are specific temperatures for the vane segments that are selected to cause the vessel 112 to operate at a desired vessel temperature. The controller 142 uses the adjustable setpoints 404 in the adjustable setpoint data 410 to cause the heating elements 306 to increase or decrease the temperature of a vane segment to a desired temperature stored as the setpoint temperature 412 in the setpoint temperature profile map 408. In one example, the controller 142 increases the temperature of the vane segments by sending adjustable setpoints to cause the heating elements 306 to increase the temperatures in the vane segments. In one example, the controller 142 decreases the temperatures of the vane segments by sending adjustable setpoints to cause the heating elements 306 to reduce the temperatures in the vane segments. In one example, the controller 142 decreases the temperature of the vane segments by sending adjustable setpoints to cause the heating elements 306 to turn off. In one example, the controller 142 decreases the temperatures of the vane segments by activating cooling elements 214 using the adjustable setpoints 404.

In some implementations, the setpoint temperatures 412 are selected to cause the tin to flow in the direction 210 of drainage in the vessel 112. In an example, the direction 210 of drainage is based at least in part on a direction of gravity with respect to the orientation of the vane system. In an example, the setpoint temperatures 412 may be in a range of 250° Celsius (C) to 280° C. In an example, the setpoint temperatures 412 may be greater than or in a range of a melting point of tin (Sn). In some implementations, the setpoint temperatures 412 may be the same specific value to cause the vessel 112 to maintain a uniform temperature profile. In one example, the setpoint temperatures 412 may be different values for different vane segments within the vessel 112 to cause the vessel 112 to exhibit a nonuniform temperature profile.

In some implementations, controller 142 further performs an adjustment operation 428 to generate one or more respective adjustments, based on the differences 426, to modify the adjustable setpoint data 410. As described the adjustable setpoint data 410 corresponds to values that cause the heating elements to generate the desired setpoint temperatures 412 as stored in the setpoint temperature profile map 408. A difference 426 that is non-zero indicates the respective adjustable setpoints 404 in the adjustable setpoint data 410 are not yet modified to the correct adjustable setpoints to cause the heating elements 306 to generate the desired setpoint temperatures. Accordingly, the adjustment operation 428 continues to generate adjustments to modify the adjustable setpoints 404 in the adjustable setpoint data 410.

In one example, adjustments may be a positive offset amount, to cause the controller 142 to modify the adjustable setpoint by increasing the adjustable setpoint by the positive offset amount, when the controller 142 determines the sensor temperature 424 to be less than the corresponding setpoint temperature 412. In one example, the adjustments may be a negative offset, to cause the controller 142 to modify the adjustable setpoint by decreasing the adjustable setpoint by the negative offset amount, when the controller determines the sensor temperature 424 to be greater than the corresponding setpoint temperature 412. A difference 426 that is zero or nominal indicates the respective adjustable setpoints 404 in the adjustable setpoint data 410 are the correct or near correct values to cause the heating elements 306 to generate the desired setpoint temperatures.

In some implementations, the adjustment operation 428 generates one or more modified adjustable setpoints 430 based on the differences 426, as described. In one example, the modified adjustable setpoints 430 replace the corresponding adjustable setpoints in the adjustable setpoint data 410. In some implementations, updating the one or more adjustable setpoint data 410 based on the differences 426 causes the measured sensor temperature 424 to approach the target or specified setpoint temperature 412.

In some implementations, the adjustment operation 428 generates a trigger 414, as described, to cause the adjustable setpoint management operation 402 to retrieve the adjustable setpoints 404 as replaced by the modified adjustable setpoints 430. In some implementations, the adjustable setpoint management operation 402 retrieves only the adjustable setpoints 404 as modified by the adjustment operation 428. In other implementations, the adjustable setpoint management operation 402 retrieves all of the adjustable setpoints 404, including the modified ones from the adjustable setpoint data 410.

In some implementations, the sensing operation 416, the comparison operation 422, and/or the adjustment operation 428 may be performed serially on each individual vane segment. In some implementations, the sensing operation 416, the comparison operation 422, and/or the adjustment operation 428 may be concurrently performed (e.g., performed in parallel). In some implementations, the sensing operation 416, the comparison operation 422, and/or the adjustment operation 428 may be performed periodically or repeatedly. In some implementations, the sensing operation 416, the comparison operation 422, and/or the adjustment operation 428 may be performed manually (e.g., based on a system trigger or human interaction).

In some implementations, the setpoint temperature profile map 408 with the updated adjustable setpoint data 410 results in a more accurate mapping of adjustable setpoints 404 that able to cause the sensed temperature data 418 to approach the specific temperatures designated by the desired setpoint temperatures 412. In some implementations, when the differences 426 are determined to be nominal, then the setpoint temperature profile map 408 may be stored as a standard map (e.g., "a golden map"). The stored standard setpoint temperature profile map 408 may then be used in subsequent startups of the vessel 112 to reduce the time for a vessel 112 to reach the desired setpoint temperatures 412. In some implementations, reducing the time to achieve the setpoint temperatures 412 also reduces the amount of clogging, build-up, or spitting of tin particles in the vane system 140. Such performance improvements may also result in an increased performance of the vane system 140.

In some implementations, the adjustable setpoint data 410 may be determined using a machine learning (ML) model, where the setpoint temperature profile map 408 is used as an input to the ML model. In some implementations, the controller 142 is configured to use a machine-learning model, which is trained based on historical data, to generate and/or update adjustable setpoint data 410 in the setpoint temperature profile map 408. For example, the machine-learning model may correlate historical adjustable setpoints 410 and the setpoint temperatures 412. Examples of historical adjustable setpoint data 410 and the setpoint temperatures 412 may include convergence rates of the adjustable setpoints 404 resulting in an increased efficiency of the sensor temperatures approaching the setpoint temperatures, among other examples.

In one example, the controller 142 modifies the adjustable setpoint based on the ML model and the one or more differences 426. Rather than relying solely on the one or more differences 426 to converge the sensor temperature to the setpoint temperature, the ML model may modify the one or more adjustable setpoints at a rate that reduces the convergence time.

In some implementations, an adjustable setpoint management operation 402 transmits the one or more adjustable setpoints 404 to a power supply 406. Power supply 406 generates the heating control signals 308 for driving the heating elements 306A-1 through 306A-3 in the vane system 140.

In some implementations, the process described herein of modifying the one or more adjustable setpoints 404 may be automated by repeatedly executing the processes described herein including determining the one or more differences 426, modifying the one or more adjustable setpoints 404, and transmitting the one or more adjustable setpoints 404 to cause the temperatures at the respective one or more vane segments to approach the one or more setpoint temperatures 412 for the one or more vane segments.

In some implementations, the process described herein may further include activating, by the controller 142 during an operation, the first heating element 306A-1 in a first vane segment 304A-1 of a vane 302A based on the adjustable setpoint 404 to increase a temperature of the first vane segment. When the controller 142 determines the temperature 424 of the first vane segment 304A-1 satisfies a setpoint temperature 412 corresponding to the adjustable setpoint, the controller 142 deactivates the first heating element 306A-1 by temporarily transmitting a lesser value or no value as the adjustable setpoint 404 to the power supply 406. The lesser value or no value as the adjustable setpoint 404 causes the power supply 406 to temporarily cease driving the first heating element 306A-1 at a level that causes an decrease in the temperature 424 at the first vane segment 304A-1. In an example, the controller determines the temperature 424 of the first vane segment by receiving an indication (e.g., sensor signal 312) of the temperature of the first vane segment 304A-1, and comparing the temperature 424 of the first vane segment 304A-1 with the setpoint temperature 412.

In some implementations, the process described herein may further include activating the second heating element 306A-2 at a time that is different from a time at which the first heating element 306A-1 is activated. In an example, the activation and deactivation of the second heating element 306A-2 is performed in the manner described herein with respect to the first heating element 306A-1.

In some implementations, a temperature gradient exists when adjacent vane segments are at different temperatures. The process described herein may further include activating and deactivating the first heating element 306A-1 to reduce a temperature gradient along the first vane 302A. As differences in sensor temperatures and setpoint temperatures are identified, the controller 142 activates specific heating elements to cause the sensor measured temperatures to approach the specific setpoint temperatures, thereby reducing the temperature gradient along the vane.

The controller 142 may reactivate the first heating element 306A-1 when the difference 426 exceeds a threshold. The threshold may be determined based on operational parameters identified to avoid oscillations by the power supply 406 in driving the vane segment.

While operations have been described with respect to adjustable setpoints controlling heating elements, the use of adjustable setpoints for modifying the temperature of vane segments using cooling elements, such as cooling elements 214, are also contemplated. Further, the use of heating elements and cooling elements in combination and responsive to the adjustable setpoints is also contemplated.

As indicated above, FIG. 4 is provided as examples. Other examples may differ from what is described with regard to FIG. 4.

Figure 5:
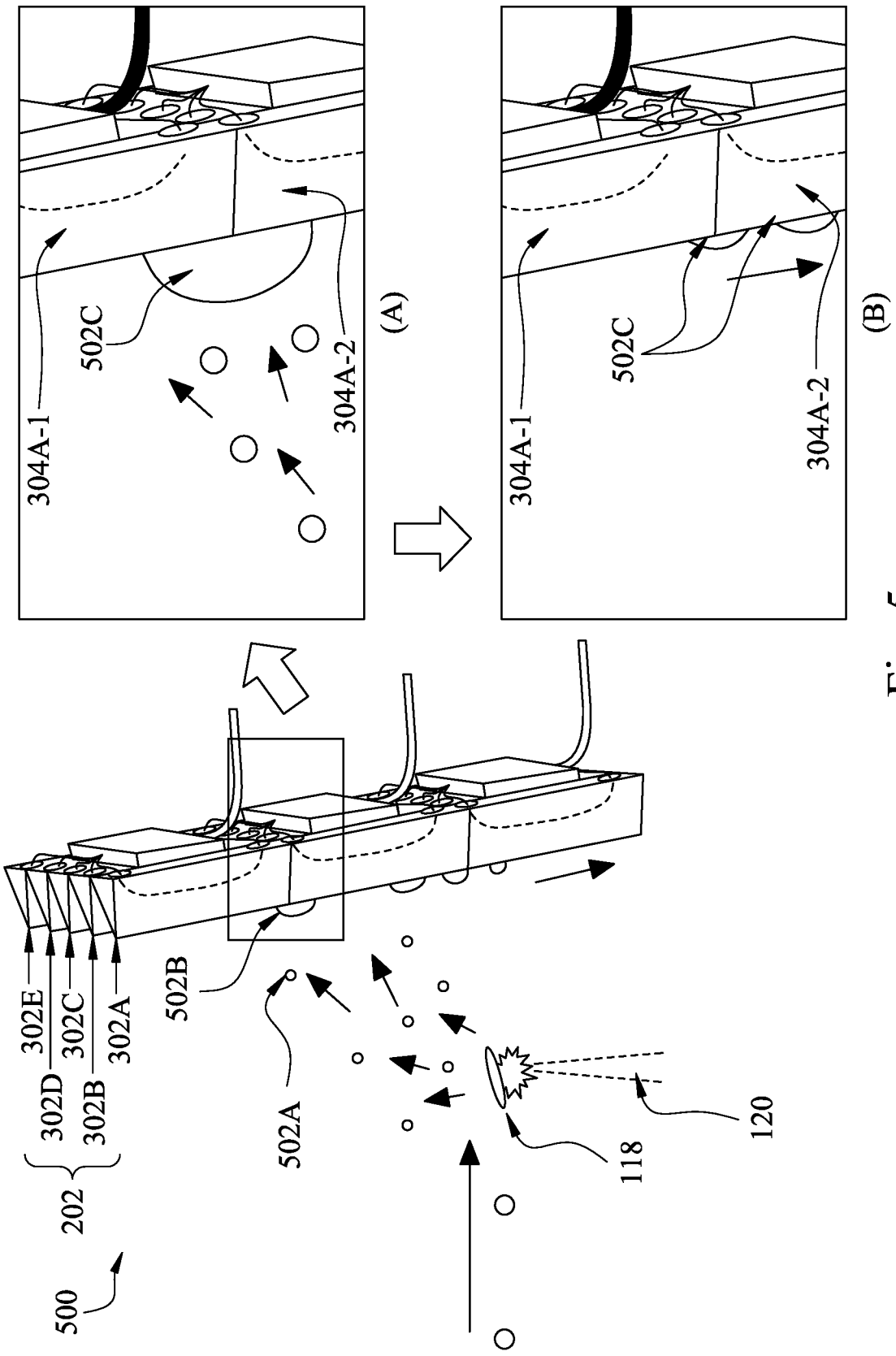
FIG. 5 is a diagram of the example components described herein performing example processes described herein for use in the lithography semiconductor processing tool of FIG. 1.

FIG. 5 is a diagram of the example components described herein in connection with performing example processes described above for use in the lithography semiconductor processing tool of FIG. 1. System 500 illustrates a portion of a vessel 112 in operation. During the generation of EUV, droplets 118 are exposed to a laser 120. The droplets 118 are not completely turned into plasma, and instead generate tin particles 502A (e.g., debris). Some of the tin particles 502B are caught or captured by the vane system 140. For example, the tin particles 502B are captured by a vane 302 in a vane group 202. The tin particles 502B then drain along the vane 302A.

As long as the temperature at the vane segments 304A, for example vane segments 304A-1 through 304A-3, are sufficient to allow the tin particles 502C to drain, the tin particles 502C will continued draining along the vane segments 304A. However, a tin build-up may occur when a temperature at a vane segment 304A, for example vane segment 304A-2, is insufficient to allow the tin particles 502C to drain. The location of the tin build-up may be known as a "cold spot" in the vane system 140. A "cold spot" typically occurs when the temperature in a vane segment drops below the melting point of tin. The tin build-up is a result of the tin particles 502B landing on the walls of the vane segment and solidifying. The build-up of tin particles 502C cause a "clog" along one or more of vane segments 304A in that the tin build-up may prevent the tin particles 502B from draining along the vane segments 304A. In response to the thermal control system 400 described herein detecting the insufficient temperature at vane segment 304A-2, the thermal control system 400 increases the temperature at the specific vane segment (e.g., the vane segment 304A-2) such that the temperature at the vane segment 304A-2 is increased to a temperature that is above the melting point of tin. This causes the tin build-up to be melted, which enables the tin particles 502C to drain along the vane 302A, as illustrated in inset (B).

As indicated above, FIG. 5 is provided as examples. Other examples may differ from what is described with regard to FIG. 5.

Figure 6:
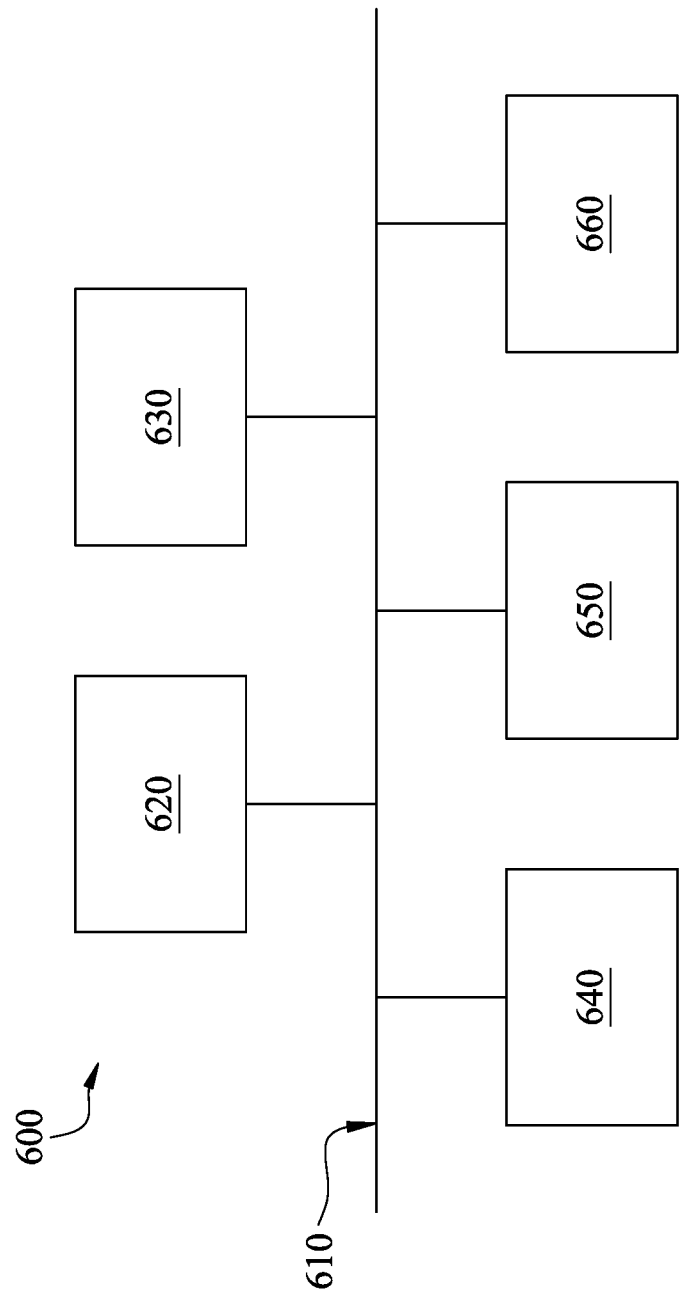
FIG. 6 is a diagram of example components of one or more devices of FIG. 1 described herein.

FIG. 6 is a diagram of example components of a device 600, which may correspond to vane system 140, and controller 142. In some implementations, vane system 140, and controller 142 may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a temperature sensor, touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a power supply, heating element, display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
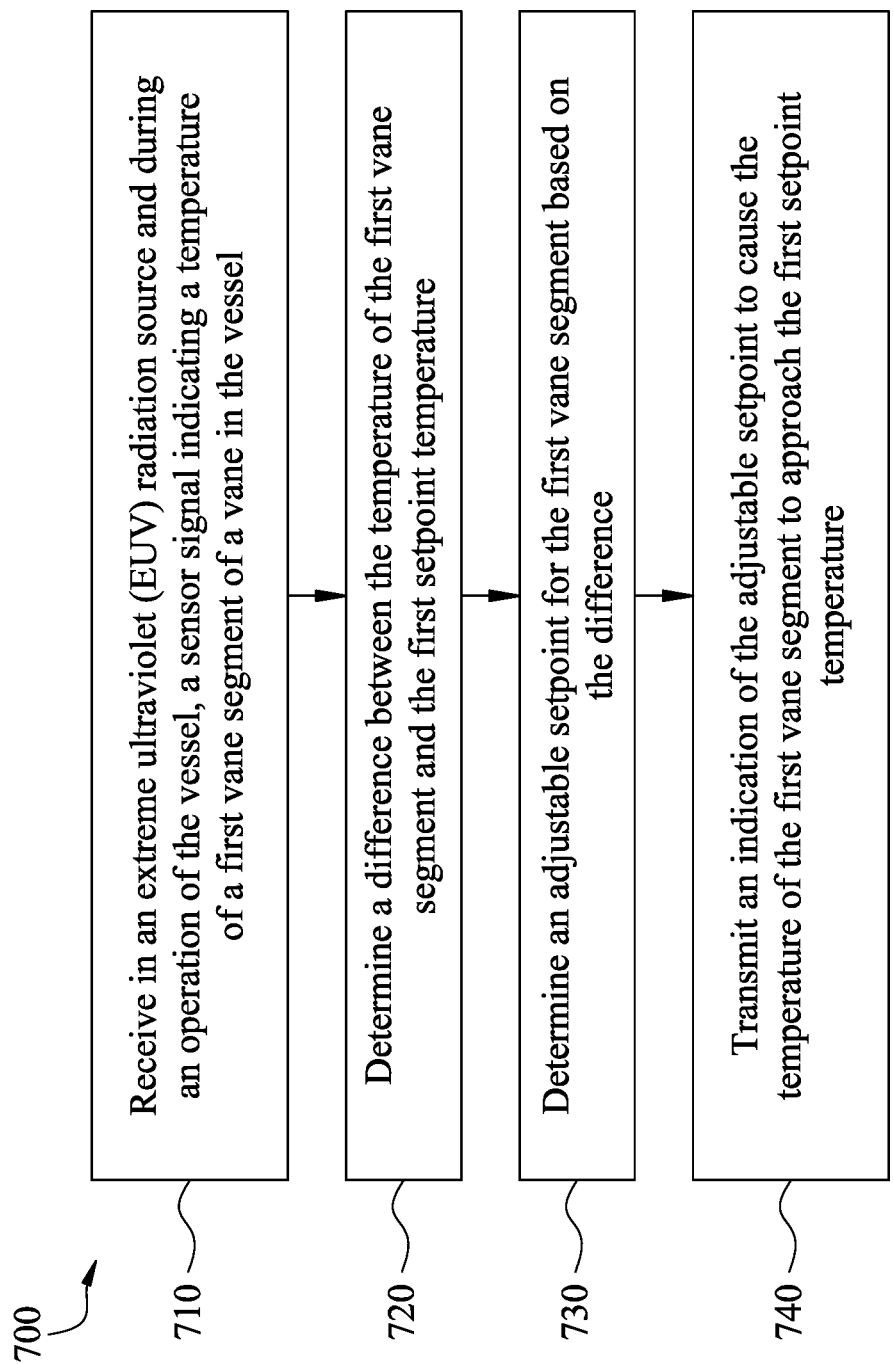
FIGS. 7 and 8 are flowcharts of example processes relating to operating a thermal control system for a lithography system described herein.

FIG. 7 is a flowchart of an example process 700 associated with a proactive thermal control system for an EUV source. In some implementations, one or more process blocks of FIG. 7 may be performed by a controller (e.g., controller 142). In some implementations, one or more process blocks of FIG. 7 may be performed by another device or a group of devices separate from or including the controller, such as a vane system (e.g., vane system 140), a controller (e.g., controller 142), a radiation source (e.g., radiation source 102), and a radiation tool (radiation tool 104). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include receiving, during an operation of the vessel, a sensor signal indicating a temperature of a first vane segment of a vane in the vessel (block 710). For example, the controller 142 may receive, during an operation of the vessel 112, a sensor signal 312 indicating a temperature 424 of a first vane segment 304A-1 of a vane 302A in the vessel 112, as described above. In some implementations, the vane 302A includes the first vane segment 304A-1 and a second vane segment 304A-2 that are adjacent in a direction 210 of drainage of tin (Sn) along the vane 302A. In some implementations, a first setpoint temperature 412 for the first vane segment 304A-1 is independently controllable from a second setpoint temperature 412 for the second vane segment 304A-2.

As further shown in FIG. 7, process 700 may include determining, during the operation, a difference between the temperature of the first vane segment and the first setpoint temperature (block 720). For example, the controller 142 may determine, during the operation, a difference 426 between the temperature 424 of the first vane segment 304A-1 and the first setpoint temperature 412, as described above.

As further shown in FIG. 7, process 700 may include determining, during the operation, an adjustable setpoint for the first vane segment based on the difference (block 730). For example, the controller 142 may determine, during the operation, an adjustable setpoint 404 for the first vane segment 304A-1 based on the difference 426, as described above.

As further shown in FIG. 7, process 700 may include transmitting, during the operation, an indication of the adjustable setpoint to cause the temperature of the first vane segment to approach the first setpoint temperature (block 740). For example, the controller 142 may transmit, during the operation, an indication of the adjustable setpoint 404 to cause the temperature 424 of the first vane segment 304A-1 to approach the first setpoint temperature 412, as described above.

Process 700 may include additional implementations, such as any single implementation or any combination of implementations described below and/or in connection with one or more other processes described elsewhere herein.

In a first implementation, process 700 includes generating a setpoint temperature profile map 408 that includes the first setpoint temperature and the adjustable setpoint for the first vane segment and the second setpoint temperature and another adjustable setpoint 404 for the second vane segment. The first setpoint temperature for the first vane segment and the second setpoint temperature for the second vane segment cause the tin to flow in the direction of drainage in the vessel.

In a second implementation, alone or in combination with the first implementation, process 700 includes determining the adjustable setpoint to cause the first vane segment to reach the first setpoint temperature in the first vane segment. The process further includes determining the other adjustable setpoint to cause the second vane segment to reach the second setpoint temperature in the second vane segment. Further, the process includes updating the adjustable setpoint and the other adjustable setpoint in the setpoint temperature profile map respectively based on the first setpoint temperature and the second setpoint temperature.

In a third implementation, alone or in combination with one or more of the first and second implementations, the process of determining the adjustable setpoint includes determining the adjustable setpoint using a machine learning (ML) model, and the setpoint temperature profile map is used as an input to the ML model.

In a fourth implementation, alone or in combination with one or more of the first through third implementations, the first setpoint temperature and the second setpoint temperature are greater than a melting point temperature of the tin.

In a fifth implementation, alone or in combination with one or more of the first through fourth implementations, process 700 includes repeatedly executing the determining of the difference, the determining of the adjustable setpoint, and the transmitting of the adjustable setpoint to cause the temperature at the first vane segment to approach the first setpoint temperature.

In a sixth implementation, alone or in combination with one or more of the first through fifth implementations, the process including transmitting the indication of the adjustable setpoint includes transmitting the indication of the adjustable setpoint to a power supply 406 to cause the power supply to provide an electrical current to a heating element 306A associated with the first vane segment, and the electrical current causes the heating element to generate heat at the first vane segment based on the adjustable setpoint.

In a seventh implementation, alone or in combination with one or more of the first through sixth implementations, the adjustable setpoint for the first vane segment in the first vane and another adjustable setpoint for the second vane segment in the vane are different.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
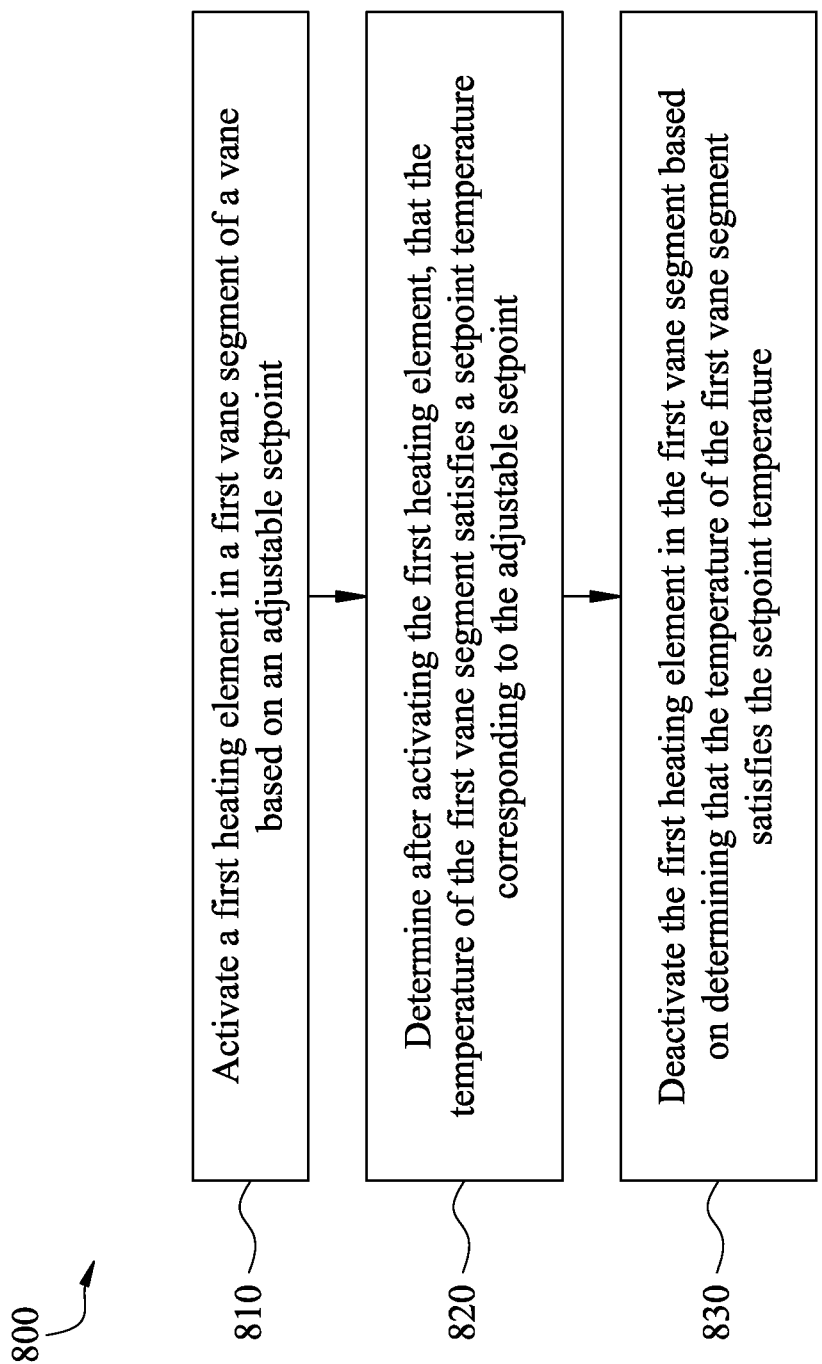

FIG. 8 is a flowchart of an example process 800 associated with a proactive thermal control system for an EUV source. In some implementations, one or more process blocks of FIG. 8 may be performed by a controller (e.g., controller 142). In some implementations, one or more process blocks of FIG. 8 may be performed by another device or a group of devices separate from or including the controller, such as a vane system (e.g., vane system 140), a controller (e.g., controller 142), a radiation source (e.g., radiation source 102), and a radiation tool (radiation tool 104). Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include activating a first heating element in a first vane segment of a vane based on an adjustable setpoint (block 810). For example, the controller 142 may activate a first heating element 306A-1 in a first vane segment 304A-1 of a vane 302A based on an adjustable setpoint 404, as described above. In some implementations, the vane 302A includes the first vane segment 304A-1 and a plurality of second vane segments 304A-2, 304A-3 that are arranged along a length of the vane 302A between a scrubber 204 of the EUV radiation source 102 and a collector 114 of the EUV radiation source 102. In some implementations, the first heating element 306A-1 is independently controllable from a second heating element 306A-2 associated with one or more of the plurality of second vane segments 304A-2, 304A-3, and is activated to increase a temperature 424 of the first vane segment 304A-1.

As further shown in FIG. 8, process 800 may include determining, after activating the first heating element, that the temperature of the first vane segment satisfies a setpoint temperature corresponding to the adjustable setpoint (block 820). For example, the controller 142 may determine, after activating the first heating element 306A-1, that the temperature 424 of the first vane segment 304A-1 satisfies a setpoint temperature 412 corresponding to the adjustable setpoint 404, as described above.

As further shown in FIG. 8, process 800 may include deactivating, during the operation, the first heating element in the first vane segment based on determining that the temperature of the first vane segment satisfies the setpoint temperature (block 830). For example, the controller 142 may deactivate, during the operation, the first heating element 306A-1 in the first vane segment 304A-1 based on determining that the temperature 424 of the first vane segment 304A-1 satisfies the setpoint temperature 412, as described above.

Process 800 may include additional implementations, such as any single implementation or any combination of implementations described below and/or in connection with one or more other processes described elsewhere herein.

In a first implementation, the process of determining that the temperature of the first vane segment satisfies the setpoint temperature includes receiving, during the operation, an indication of the temperature of the first vane segment, and comparing, during the operation, the temperature of the first vane segment and the setpoint temperature to determine that the temperature of the first vane segment satisfies the setpoint temperature.

In a second implementation, alone or in combination with the first implementation, process 800 includes generating a difference based on comparing the temperature of the first vane segment and the setpoint temperature, determining a modified adjustable setpoint temperature based on the difference, obtaining, during the operation, a setpoint temperature profile map 408, the setpoint temperature profile map that includes the setpoint temperature and the adjustable setpoint for the first vane segment, and updating the setpoint temperature profile map to include the modified adjustable setpoint as the adjustable setpoint associated with the setpoint temperature.

In a third implementation, alone or in combination with one or more of the first and second implementations, process 800 includes activating the second heating element at a time that is different from a time at which the first heating element is activated.

In a fourth implementation, alone or in combination with one or more of the first through third implementations, activating the first heating element includes activating the first heating element to cause tin (Sn) to melt on the first vane segment.

In a fifth implementation, alone or in combination with one or more of the first through fourth implementations, activating the first heating element includes activating the first heating element to cause the first heating element to reduce a temperature gradient along the vane.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

FIG. 9 is a flowchart of an example process 900 associated with a lithography exposure operation. In some implementations, one or more process blocks of FIG. 9 are performed by a lithography system (e.g., lithography system 100). Additionally, or alternatively, one or more process blocks of FIG. 9 may be performed by one or more components of device 600, such as processor 620, memory 630, input component 640, output component 650, and/or communication component 660.

As shown in FIG. 9, process 900 may include receiving a substrate with a photoresist (block 910). For example, the lithography system 100 may receive a substrate 100 with a photoresist, as described herein. The substrate 100 may be placed on a wafer stage 136 of the lithography system 100.

As further shown in FIG. 9, process 900 may include projecting extreme ultraviolet (EUV) radiation onto a reflective reticle (block 920). For example, the lithography system 100 may project EUV radiation (e.g., radiation 106) onto a reflective reticle (e.g., the reticle 108), as described herein. The reticle 108 may be included in an exposure tool 104 of the lithography system 100. A radiation source 102 of the lithography system 100 may generate the EUV radiation.

As further shown in FIG. 9, process 900 may include exposing the photoresist with the EUV radiation, wherein the EUV radiation is reflected onto the photoresist from the reflective reticle (block 930). For example, the lithography system 100 may expose the photoresist with the EUV radiation, as described herein. In some implementations, the EUV radiation is reflected onto the photoresist from the reflective reticle. In some implementations, a first heating element in a first vane segment of a vane included in an EUV radiation source that generates the EUV radiation is selectively activated or deactivated based on a setpoint temperature. In some implementations, the vane includes the first vane segment and a plurality of second vane segments that are arranged along a length of the vane between a scrubber of the EUV radiation source and a collector of the EUV radiation source. In some implementations, the first heating element is independently controllable from a second heating element associated with one or more of the plurality of second vane segments.

Process 900 may include additional implementations, such as any single implementation or any combination of implementations described below and/or in connection with one or more other processes described elsewhere herein.

In a first implementation, process 900 includes determining whether the temperature of the first vane segment satisfies the setpoint temperature, and selectively activating or deactivating the first heating element based on whether the temperature of the first vane segment satisfies the setpoint temperature.

In a second implementation, alone or in combination with the first implementation, determining whether the temperature of the first vane segment satisfies the setpoint temperature comprises receiving an indication of the temperature of the first vane segment, and comparing the temperature of the first vane segment and the setpoint temperature to determine whether the temperature of the first vane segment satisfies the setpoint temperature.

In a third implementation, alone or in combination with one or more of the first and second implementations, process 900 includes generating a difference based on comparing the temperature of the first vane segment and the setpoint temperature, determining a modified adjustable setpoint temperature based on the difference, obtaining, a setpoint temperature profile map that includes the setpoint temperature and an adjustable setpoint for the first vane segment, and updating the setpoint temperature profile map to include the modified adjustable setpoint as the adjustable setpoint associated with the setpoint temperature.

In a fourth implementation, alone or in combination with one or more of the first through third implementations, process 900 includes activating the second heating element at a time that is different from a time at which the first heating element is activated.

In a fifth implementation, alone or in combination with one or more of the first through fourth implementations, selectively activating or deactivating the first heating element comprises activating the first heating element to cause the first heating element to reduce a temperature gradient along the vane, and activating the first heating element to cause tin (Sn) to melt on the first vane segment.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Implementations described herein provide a proactive thermal control system for an EUV source. The thermal control system may include segmented thermal control elements (e.g., vane segments) that are configured to provide localized climate control to sustain a stable vessel temperature. The thermal control system may determine and/or detect temperature variations (e.g., thermal gradients, hot spots, cold spots) on the walls of a vessel of the EUV source. The thermal control system may adjust one or more parameters of nearby thermal control elements (e.g., heaters, coolers) based on the temperature variations to balance the differences in temperature along the walls of the EUV source. In this way, the thermal control system is capable of removing, preventing, and/or minimizing localized tin clogging and tin spitting. This reduces the likelihood and amount of tin accumulation on the walls of the vessel, which decreases the likelihood of collector contamination and enables sustained EUV source performance for longer time durations between maintenance (which corresponds to reduced downtime of the EUV source).

As described in greater detail above, some implementations described herein provide a method. The method includes receiving, by a controller of a vessel in an EUV radiation source and during an operation of the vessel, a sensor signal indicating a temperature of a first vane segment of a vane in the vessel, where the vane includes the first vane segment and a second vane segment that are adjacent in a direction of drainage of tin (Sn) along the vane, where a first setpoint temperature for the first vane segment is independently controllable from a second setpoint temperature for the second vane segment. The method includes determining, by the controller and during the operation, a difference between the temperature of the first vane segment and the first setpoint temperature. The method includes determining, by the controller and during the operation, an adjustable setpoint for the first vane segment based on the difference. The method includes transmitting, by the controller and during the operation, an indication of the adjustable setpoint to cause the temperature of the first vane segment to approach the first setpoint temperature.

As described in greater detail above, some implementations described herein provide a method. The method includes activating, by a controller of a vessel in an EUV radiation source during an operation, a first heating element in a first vane segment of a vane based on an adjustable setpoint, where the vane includes the first vane segment and a plurality of second vane segments that are arranged along a length of the vane between a scrubber of the EUV radiation source and a collector of the EUV radiation source, where the first heating element is activated to increase a temperature of the first vane segment, and where the first heating element is independently controllable from a second heating element associated with one or more of the plurality of second vane segments. The method includes determining, by the controller and after activating the first heating element, that the temperature of the first vane segment satisfies a setpoint temperature corresponding to the adjustable setpoint. The method includes deactivating, by the controller and during the operation, the first heating element in the first vane segment based on determining that the temperature of the first vane segment satisfies the setpoint temperature.

As described in greater detail above, some implementations described herein provide an EUV source. The EUV source includes a vessel. The EUV source includes a collector associated with the vessel. The EUV source includes a plurality of vanes along walls of the vessel, where each vane of the plurality of vanes comprises a respective plurality of stacked vane segments, and where the respective plurality of stacked vane segments for each vane of the plurality of vanes are stacked in a direction of drainage of tin (Sn) in the vessel. The EUV source includes a thermal control system comprising a plurality of independently controllable heating elements, where a heating element, of the plurality of independently controllable heating elements, is configured to provide localized control for heating of a vane segment of the respective plurality of stacked vane segments.

As described in greater detail above, some implementations described herein provide a method. The method includes receiving a substrate with a photoresist. The method includes projecting EUV radiation onto a reflective reticle. The method includes exposing the photoresist with the EUV radiation, where the EUV radiation is reflected onto the photoresist from the reflective reticle, where a first heating element in a first vane segment of a vane included in an EUV radiation source that generates the EUV radiation is selectively activated or deactivated based on a setpoint temperature, where the vane includes the first vane segment and a plurality of second vane segments that are arranged along a length of the vane between a scrubber of the EUV radiation source and a collector of the EUV radiation source, and where the first heating element is independently controllable from a second heating element associated with one or more of the plurality of second vane segments.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving, by a controller of a vessel in an extreme ultraviolet (EUV) radiation source and during an operation of the vessel, a sensor signal indicating a temperature of a first vane segment of a vane in the vessel,
wherein the vane includes the first vane segment and a second vane segment that are adjacent in a direction of drainage of tin along the vane;
determining, by the controller and during the operation, a difference between the temperature of the first vane segment and a first setpoint temperature for the first vane segment, wherein the first setpoint temperature corresponds to a desired temperature of the first vane segment;
determining, by the controller, during the operation, and based on the difference, an adjustment to a first adjustable setpoint for the first vane segment, wherein the first adjustable setpoint corresponds to a value for generating an amount of heat or cold air to cause the first vane segment to approach the first setpoint temperature, wherein the first adjustable setpoint for the first vane segment in the vane and another adjustable setpoint for the second vane segment in the vane are different;
transmitting, by the controller, during the operation, and based on determining the adjustment to the first adjustable setpoint, an indication of a first adjusted setpoint;
determining, by the controller, that the first adjusted setpoint causes the first vane segment to reach the first setpoint temperature; and
replacing, by the controller based on determining the first adjusted setpoint causes the first vane segment to reach the first setpoint temperature, the first adjustable setpoint, in a setpoint temperature profile map, with the first adjusted setpoint.

2. The method of claim 1, further comprising:
generating the setpoint temperature profile map, wherein the setpoint temperature profile map includes the first setpoint temperature and the first adjustable setpoint for the first vane segment, wherein the first setpoint temperature for the first vane segment is to cause the tin to flow in the direction of drainage in the vessel, and wherein replacing the first adjustable setpoint is after generating the setpoint temperature profile map.

3. The method of claim 1, wherein determining the first adjustable setpoint comprises:
determining the first adjustable setpoint using a machine learning (ML) model,
wherein the setpoint temperature profile map is used as an input to the ML model, and
wherein the ML model determines the adjustable setpoint based on the setpoint temperature profile map and historical data.

4. The method of claim 1, wherein the first setpoint temperature is greater than a melting point temperature of the tin.

5. The method of claim 1, further comprising:
repeatedly executing the determining of the difference, the determining of the adjustment to the first adjustable setpoint, and the transmitting of the indication of the first adjusted setpoint to cause the temperature at the first vane segment to approach the first setpoint temperature.

6. The method of claim 1, wherein transmitting the indication of the first adjusted setpoint comprises:
   transmitting, to a power supply, the indication of the first adjusted setpoint to a power supply, wherein the indication is associated with providing an electrical current to a heating element associated with the first vane segment, wherein the electrical current is to cause the heating element to generate heat at the first vane segment based on the adjustable setpoint.

7. The method of claim 1, wherein the setpoint temperature profile map further includes a second setpoint temperature and a second adjustable setpoint for the second vane segment, wherein the second setpoint temperature corresponds to a desired temperature for the second vane segment, and wherein the second adjustable setpoint corresponds to a value for generating an amount of heat or cold air to cause the second vane segment to approach the second setpoint temperature.

8. The method of claim 1, wherein the vane is along a wall of the vessel.

9. A method, comprising:
   receiving a substrate with a photoresist;
   projecting extreme ultraviolet (EUV) radiation onto a reflective reticle;
   exposing the photoresist with the EUV radiation,
      wherein the EUV radiation is reflected onto the photoresist from the reflective reticle,
      wherein a first heating element in a first vane segment of a vane included in an EUV radiation source that generates the EUV radiation is selectively activated or deactivated based on a setpoint temperature,
      wherein the vane includes the first vane segment and a plurality of second vane segments that are arranged along a length of the vane, and
      wherein the first heating element is independently controllable from a second heating element associated with one or more of the plurality of second vane segments;
   determining whether a temperature of the first vane segment satisfies the setpoint temperature;
   selectively activating or deactivating the first heating element based on whether the temperature of the first vane segment satisfies the setpoint temperature; and
   activating the second heating element at a time that is different from a time at which the first heating element is activated.

10. The method of claim 9, wherein determining whether the temperature of the first vane segment satisfies the setpoint temperature comprises:
   receiving an indication of the temperature of the first vane segment; and
   comparing the temperature of the first vane segment and the setpoint temperature to determine whether the temperature of the first vane segment satisfies the setpoint temperature.

11. The method of claim 9, further comprising:
   generating a difference based on comparing the temperature of the first vane segment and the setpoint temperature;
   obtaining a setpoint temperature profile map that includes the setpoint temperature and an adjustable setpoint for the first vane segment;
   determining, based on generating the difference and obtaining the setpoint temperature profile map, a modified adjustable setpoint, corresponding to an adjustment of the adjustable setpoint, based on the difference, wherein the adjustable setpoint corresponds to a value for generating an amount of heat to cause the first vane segment to approach the setpoint temperature; and
   updating the setpoint temperature profile map to include the modified adjustable setpoint as the adjustable setpoint associated with the setpoint temperature.

12. The method of claim 9, wherein selectively activating or deactivating the first heating element comprises:
   activating the first heating element to cause the first heating element to reduce a temperature gradient along the vane; and
   activating the first heating element to cause tin (Sn) to melt on the first vane segment.

13. The method of claim 9, wherein the vane is along a wall of a vessel in the EUV radiation source.

14. An extreme ultraviolet (EUV) source, comprising:
   a vessel;
   a collector associated with the vessel;
   a plurality of vanes along walls of the vessel,
      wherein each vane of the plurality of vanes comprises a respective plurality of stacked vane segments that are independently removable, and
      wherein the respective plurality of stacked vane segments for each vane of the plurality of vanes are stacked in a direction of drainage of tin (Sn) in the vessel; and
   a thermal control system comprising a plurality of independently controllable heating elements,
      wherein a heating element, of the plurality of independently controllable heating elements, is configured to provide localized control for heating of a vane segment of the respective plurality of stacked vane segments.

15. The EUV source of claim 14, wherein a subset of the plurality of independently controllable heating elements, that is associated with a plurality of vane segments of a vane included in the plurality of vanes, is configured to provide localized thermal control along the vane.

16. The EUV source of claim 14, further comprising:
   a plurality of sensors,
      wherein a sensor, of the plurality of sensors, is configured to generate a temperature associated with the vane segment associated with the heating element.

17. The EUV source of claim 14, further comprising:
   a heating pack configured to control a subset of the plurality of independently controllable heating elements that is associated with a plurality of vane segments in adjacent ones of the plurality of vanes.

18. The EUV source of claim 17, wherein the heating pack is configured to distribute electrical current from a power supply to the subset of the plurality of independently controllable heating elements.

19. The EUV source of claim 14, wherein the heating element, that is associated with the vane segment, is configured to increase a temperature of the vane segment to eliminate a cold spot located at the vane segment.

* * * * *